United States Patent
Sotome et al.

(10) Patent No.: US 9,338,926 B2
(45) Date of Patent: May 10, 2016

(54) COOLING STRUCTURE FOR ELECTRONIC CIRCUIT COMPONENT AND INVERTER APPARATUS USING THE SAME

(71) Applicant: MITSUBISHI ELECTRIC CORPORATION, Chiyoda-ku, Tokyo (JP)

(72) Inventors: Hideyuki Sotome, Chiyoda-ku (JP); Takaya Muto, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 330 days.

(21) Appl. No.: 13/873,953

(22) Filed: Apr. 30, 2013

(65) Prior Publication Data

US 2014/0063747 A1   Mar. 6, 2014

(30) Foreign Application Priority Data

Aug. 30, 2012 (JP) .................................. 2012-189433

(51) Int. Cl.
| | | |
|---|---|---|
| *H05K 7/20* | (2006.01) | |
| *H05K 1/14* | (2006.01) | |
| *H02M 7/00* | (2006.01) | |
| *H02M 1/00* | (2006.01) | |

(52) U.S. Cl.
CPC .............. *H05K 7/2039* (2013.01); *H05K 7/209* (2013.01); *H01L 2924/0002* (2013.01); *H02M 7/003* (2013.01); *H02M 2001/0009* (2013.01)

(58) Field of Classification Search
CPC ............ H01L 2224/48227; H01L 2224/32245
USPC .................................. 361/718–720, 738, 743
See application file for complete search history.

(56) References Cited

U.S. PATENT DOCUMENTS

| | | | |
|---|---|---|---|
| 2002/0186545 A1* | 12/2002 | Fukada et al. ................. | 361/719 |
| 2006/0061969 A1* | 3/2006 | Nilson et al. .................. | 361/704 |
| 2006/0232942 A1* | 10/2006 | Nakatsu et al. ............... | 361/710 |
| 2010/0001382 A1* | 1/2010 | Udompanyavit et al. ..... | 257/666 |
| 2011/0100681 A1* | 5/2011 | Kimmich et al. ............. | 174/252 |
| 2011/0194255 A1* | 8/2011 | Yamashita et al. ............ | 361/711 |
| 2011/0194321 A1* | 8/2011 | Amano et al. ................. | 363/126 |

FOREIGN PATENT DOCUMENTS

| | | |
|---|---|---|
| JP | 08-167680 A | 6/1996 |
| JP | 2000-068102 A | 3/2000 |
| JP | 2009-010082 A | 1/2009 |

OTHER PUBLICATIONS

Japanese Office Action issued Nov. 12, 2013 in Patent Application No. 2012-189433.
Japanese Office Action (Decision of Refusal) issued Mar. 25, 2014 Patent Application No. 2012-189433.

* cited by examiner

*Primary Examiner* — Adam B Dravininkas
(74) *Attorney, Agent, or Firm* — Sughrue Mion, PLLC; Richard C. Turner

(57) ABSTRACT

A cooling structure for a shunt resistor has a semiconductor switching element mounted on a component side of a circuit board, a shunt resistor surface-mounted a solder side of the circuit board, a radiator for releasing heat generated from the semiconductor switching element and the shunt resistor, and an insulating material interposed between the shunt resistor and the radiator and having a high thermal conductivity.

8 Claims, 4 Drawing Sheets

COOLING STRUCTURE FOR ELECTRONIC CIRCUIT COMPONENT AND INVERTER APPARATUS USING THE SAME

BACKGROUND OF THE INVENTION

1. Field of the Invention

This invention relates to a cooling structure for an electronic circuit component that is an improved cooling structure for a shunt resistor surface-mounted on a circuit board, and to an inverter apparatus using the same.

2. Description of the Related Art

In recent years, electric motors equipped with inverters have been increasingly popular because of the trend toward energy saving. These inverter apparatuses are provided with a current detecting circuit for detecting direct current to the power supply and electric current flowing through the electric motor, for the purpose of preventing the inverter breakage due to overcurrent or for the purpose of position-sensorless vector control of the electric motor.

A commonly-used structure of the just-described current detecting circuit is a current detecting circuit having a current sensor and a shunt resistor. However, because the current sensor has a large physical size, it leads to the problem of size increase of the inverter apparatus.

On the other hand, as for a current detecting device using the shunt resistor, a small-sized shunt resistor with an ultra-low resistance value of a few hundred micro-Ω that can be surface-mounted on a wiring board has been developed because of the technological advancement in recent years. Thus, it is advantageous in that a small-sized current detecting circuit can be constructed.

However, the shunt resistor generates heat with the square of the electric current value, so if the current-carrying capacity of the inverter apparatus becomes larger, the heat generation of the shunt resistor cannot be ignored, and the heat generation becomes a problem.

In particular, in the case of a surface mount-type flat panel-shaped shunt resistor, the generated heat is radiated mainly through the wiring board. Therefore, when the current-carrying capacity of the inverter apparatus becomes larger, the problem arises that the temperatures of the wiring board and the component parts in the surrounding region are increased by the influence of the heat generated by the shunt resistor.

In view of this, it is possible to conceive an inverter apparatus as shown in FIG. 7. For example, a heat sink 9 is provided on a solder side opposite to a component side of a circuit board 7 made of resin for cooling semiconductor switching elements 1 mounted on the component side of the circuit board 7. An insulating material 8 having a high thermal conductivity is interposed between the heat sink 9 and the circuit board 7, so as to release the heat generated from the shunt resistor 4, which is mounted on the component side of the circuit board 7, via a lead terminal 4b of the shunt resistor 4, a circuit pattern 6, and the circuit board 7 made of resin. Note that reference symbol 4a indicates a resistor of the shunt resistor 4.

In addition, for example, JP-A-2009-10082 (Patent Document 1) proposes, as a cooling method for the shunt resistor mounted on a wiring board other than the above-described method, a structure in which the heat generated by the shunt resistor is released from a radiator by providing the radiator on the opposite side to the side of the wiring board on which the shunt resistor is mounted.

[Patent Document 1] JP-A-2009-10082

As described above, the inverter apparatus having a great current-carrying capacity employs a structure in which the insulating material 8 having a high thermal conductivity is interposed between the circuit board 7 and the heat sink 9, and cooling is conducted by the radiator composed of the heat sink 9, as shown in FIG. 7, in order to release the heat from the heat-generating component parts such as power elements and shunt resistors. However, an extra cooling means for the shunt resistor 4 is required when the heat quantity generated by the shunt resistor 4 is great and cooling for the shunt resistor 4 is insufficient, even with the use of the cooling means for the shunt resistor 4 as described above.

Further cooling for the shunt resistor may be possible when the structure as in Patent Document 1 is used. However, a radiator for cooling the shunt resistor becomes necessary also on the upper side of the shunt resistor separately from the radiator for cooling the semiconductor switching element. This results in the problem of an increase in size of the inverter apparatus.

SUMMARY OF THE INVENTION

This invention solves the foregoing problems, and it is an object of the invention to provide a cooling structure for an electronic circuit component that has a surface mount-type shunt resistor mounted on a solder side of a circuit board and that uses a radiator, such as a heat sink used in related inverter apparatus, for cooling the shunt resistor, as well as an inverter apparatus using the same.

A cooling structure for an electronic circuit component according to this invention includes: a semiconductor switching element mounted on a component side of a circuit board; a shunt resistor surface-mounted on a solder side opposite to the component side of the circuit board and including a metal lead terminal and a resistor; a radiator provided on the solder side of the circuit board and configured to release heat generated from the shunt resistor; and an insulating material interposed between the shunt resistor and the radiator and having a high thermal conductivity, wherein the heat generated from the semiconductor switching element is released from the radiator through the insulating material and the heat generated from the shunt resister is released through a heat transfer passage in which heat is transferred from the resistor to the radiator via the lead terminal and the heat insulating material and through a heat transfer passage in which heat is transferred from the resistor to the radiator via the insulating material.

According to the invention, for the shunt resistor, a plurality of cooling passages for releasing heat from the resistor of the shunt resistor directly to the radiator for releasing heat from the semiconductor switching element via the insulating material having a high thermal conductivity can be additionally provided in addition to the passage for releasing heat from the lead terminal of the shunt resistor. Therefore, a new radiator for cooling the shunt resistor is not needed, and it is possible to improve the cooling performance for the shunt resistor.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Hereinbelow, preferred embodiments of a cooling structure for an electronic circuit component according to this invention and an inverter apparatus using the same will be described with reference to the drawings.

First Embodiment

Figure 1:
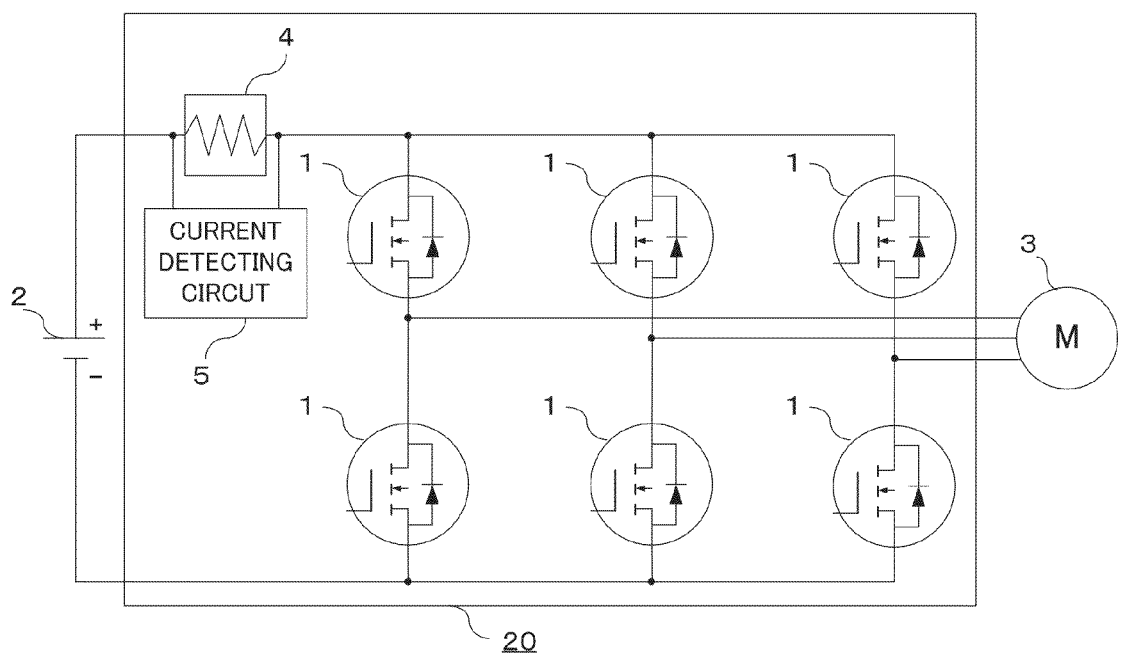
FIG. 1 is a circuit diagram showing an inverter apparatus using a cooling structure for an electronic circuit component according to a first embodiment of this invention.

FIG. 1 is one example of a circuit diagram of an inverter apparatus using a cooling structure for an electronic circuit component according to a first embodiment of this invention. An inverter apparatus 20 is a three-phase inverter apparatus having a plurality of semiconductor switching elements 1, such as IGBTs and MOSFETs. Its circuit configuration is such that a DC voltage from a DC power supply 2 is converted into three-phase alternating voltage by switching operations of the semiconductor switching elements 1, so as to drive an electric motor 3.

Moreover, the inverter apparatus 20 is provided with a current detecting circuit 5 containing a shunt resistor 4 in order to detect the current of a DC power supply 2. The electric current value flowing through the shunt resistor 4 can be detected by the current detecting circuit 5 using the voltage between both ends of the shunt resistor 4, which is generated by the current passing through the shunt resistor 4.

Figure 2:
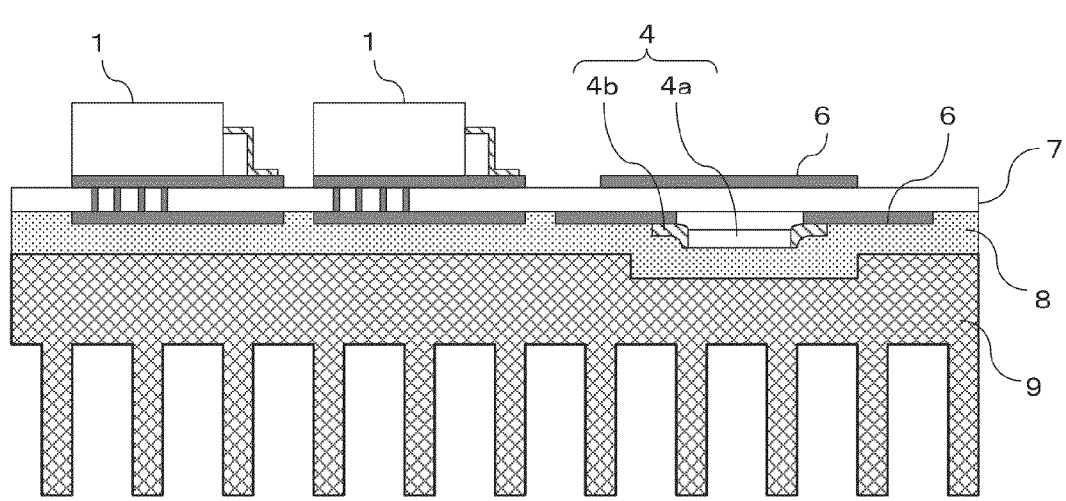
FIG. 2 is a schematic side view showing the inverter apparatus using the cooling structure for an electronic circuit component according to the first embodiment of this invention.

Next, an inverter apparatus 20 according to the first embodiment will be described with reference to FIG. 2. FIG. 2 is a schematic cross-sectional view of the inverter apparatus 20.

As shown in FIG. 2, in the inverter apparatus 20 according to the first embodiment, the semiconductor switching elements 1 are mounted on a component side of a circuit board 7 made of a resin, on both sides of which wiring patterns 6 are formed. Moreover, the shunt resistor 4 having a resistor 4a and a lead terminal 4b are surface-mounted on a solder side opposite to the component side of the circuit board 7. In addition, a heat sink 9 is provided on the solder side of the circuit board 7 with an insulating material 8 interposed therebetween. The insulating material 8 has a high thermal conductivity and is electrically insulative. The heat sink 9 is an air-cooling type radiator in which wind can be blown therein naturally or forcibly, and the heat generated from the semiconductor switching elements 1 and the shunt resistor 4 is released by the heat sink 9.

It should be noted that in FIG. 2, only the semiconductor switching elements 1 and the shunt resistor 4 are mounted on the circuit board 7, but in reality, the inverter apparatus 20 of course has other circuit components as well. However, the other circuit components are not depicted herein.

The insulating material 8 having a high thermal conductivity has a thermal conductivity of 0.1 W/m·K or higher, and representative examples include graphite sheet, heat conductive gel, silicone rubber sheet, and silicone grease.

Figure 3:
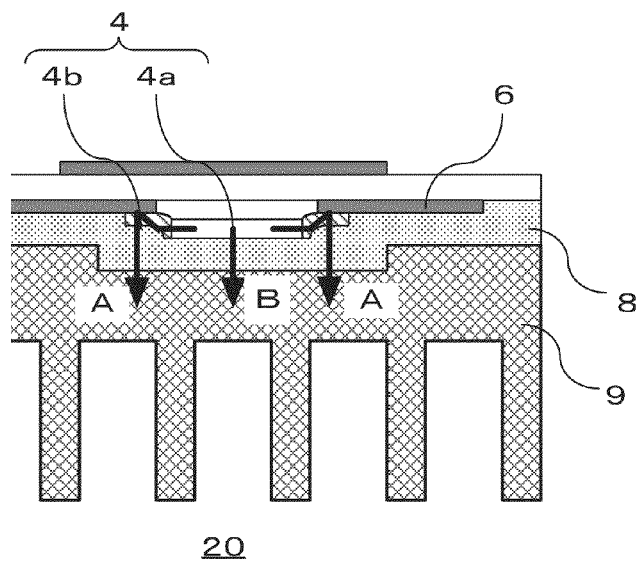
FIG. 3 is a schematic side view showing a heat release passage for the electronic circuit component according to the first embodiment of this invention.

Next, the advantageous effects obtained by using the cooling structure for an electronic circuit component according to the first embodiment will be described with reference to FIG. 3. FIG. 3 is a schematic view showing heat release passages for the shunt resistor 4.

As shown in FIG. 3, the heat generated by the shunt resistor 4 can be released through a plurality of heat transfer passages, namely, a heat transfer passage A, in which heat is transferred to the heat sink 9 via the resistor 4a, the lead terminal 4b, the wiring pattern 6, and the insulating material 8, and a heat transfer passage B, in which heat is transferred from the resistor 4a via the insulating material 8 to the heat sink 9. As a result, the cooling performance for the shunt resistor 4 can be enhanced without providing an extra radiator for cooling the shunt resistor 4, in addition to the heat sink 9 for releasing heat, such as in the related inverter apparatus.

Second Embodiment

Figure 4:
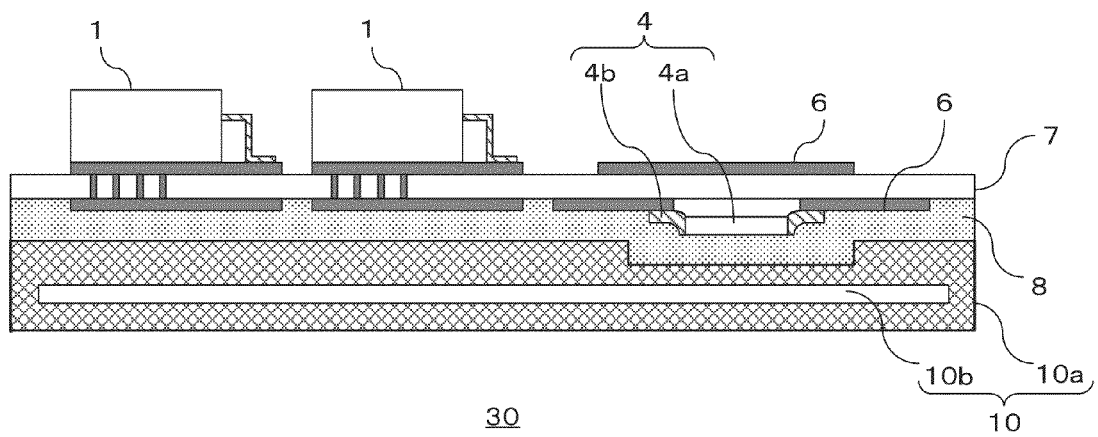
FIG. 4 is a schematic side view showing an inverter apparatus using a cooling structure for an electronic circuit component according to a second embodiment of this invention.

Next, an inverter apparatus using a cooling structure for an electronic circuit component according to a second embodiment will be described. FIG. 4 is a schematic side view showing the inverter apparatus using the cooling structure for an electronic circuit component according to the second embodiment. In FIG. 4, the same parts as or corresponding parts to those of the first embodiment shown in FIG. 2 are designated by the same reference numerals, and the explanations thereof are omitted.

This second embodiment is different from the first embodiment only in the respect that the radiator of an inverter apparatus 30 is a water-cooled type radiator 10, and the rest of the configuration is the same as that of the first embodiment. The water-cooled type radiator 10 has a housing 10a made of a metal such as aluminum, and a flow passage 10b, in which a cooling medium such as coolant flows, is formed in the housing 10a. By using such a water-cooled type radiator 10, an additional heat release effect can be expected in comparison with the air-cooling type radiator using a heat sink, and the temperature increase of the shunt resistor 4 can be further prevented. Moreover, it becomes possible to reduce the size of the radiator because the heat release performance improves, so it becomes possible to reduce the overall size of an inverter apparatus 30.

Third Embodiment

Next, an inverter apparatus using a cooling structure for an electronic circuit component according to a third embodiment will be described with reference to FIGS. 5 and 6.

Figure 5:
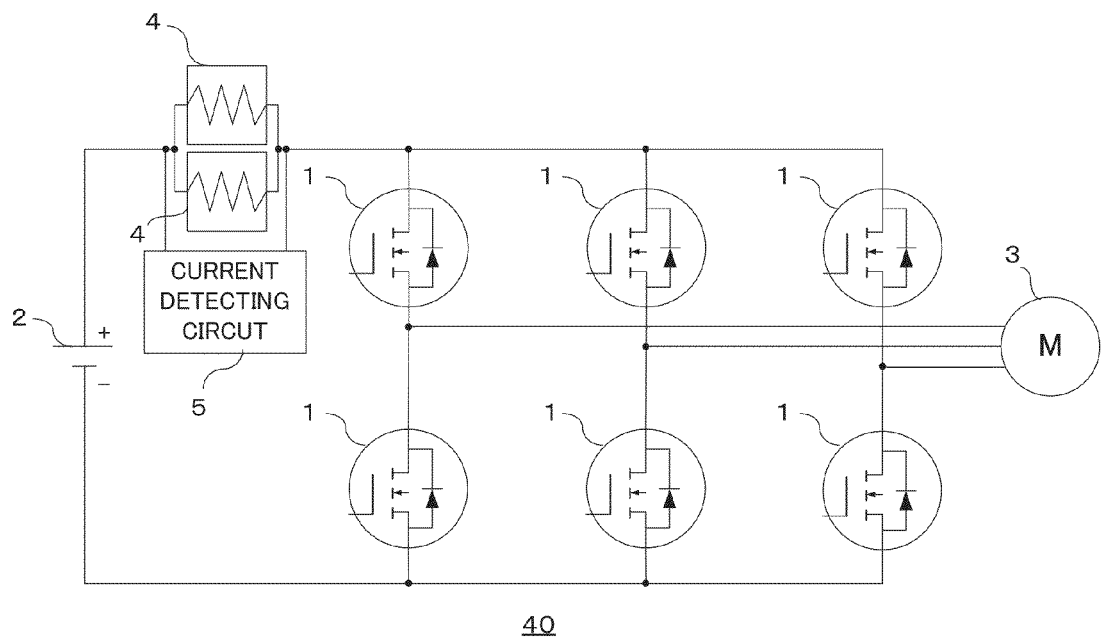
FIG. 5 is a circuit diagram showing an inverter apparatus using a cooling structure for an electronic circuit component according to a third embodiment of this invention.

FIG. 5 is one example of a circuit diagram showing an inverter apparatus 40 using the cooling structure for an electronic circuit component according to the third embodiment. In FIG. 5, the same parts as or corresponding parts to those of the first embodiment shown in FIG. 1 are designated by the same reference numerals. The operation of the inverter apparatus 40 is the same as that of the first embodiment. However, the third embodiment is different from the first embodiment in the respect that shunt resistors 4 are connected in parallel to provide a current detecting circuit 5, in order to detect the current of a DC power supply 2.

The shunt resistor 4 generally has a specified rated power. If the shunt resistor 4 is used above the rated power, its reliability is lowered. In such a case that the shunt resistor 4 exceeds the rated power with an inverter apparatus having a great current-carrying capacity, the shunt resistors 4 should be connected in parallel as in the structure of the third embodiment. Thereby, for example, when two shunt resistors each having the same resistance value are connected in parallel, the current passing per one shunt resistor becomes ½, and the generated heat quantity (electric power) can be reduced to ¼ in comparison with the case that the current detecting circuit is constructed using only one shunt resistor 4.

Figure 6:
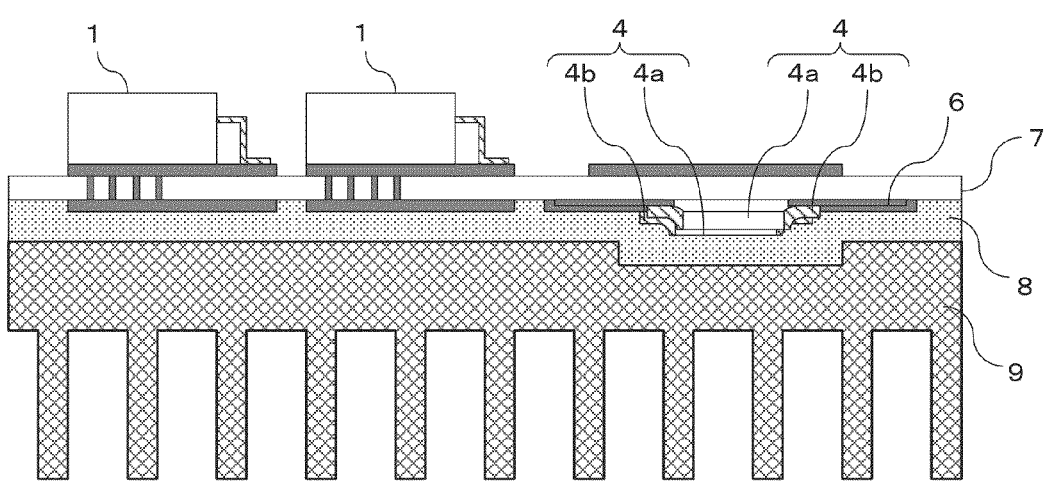
FIG. 6 is a schematic side view showing the inverter apparatus using the cooling structure for an electronic circuit component according to the third embodiment of this invention.
Figure 7:
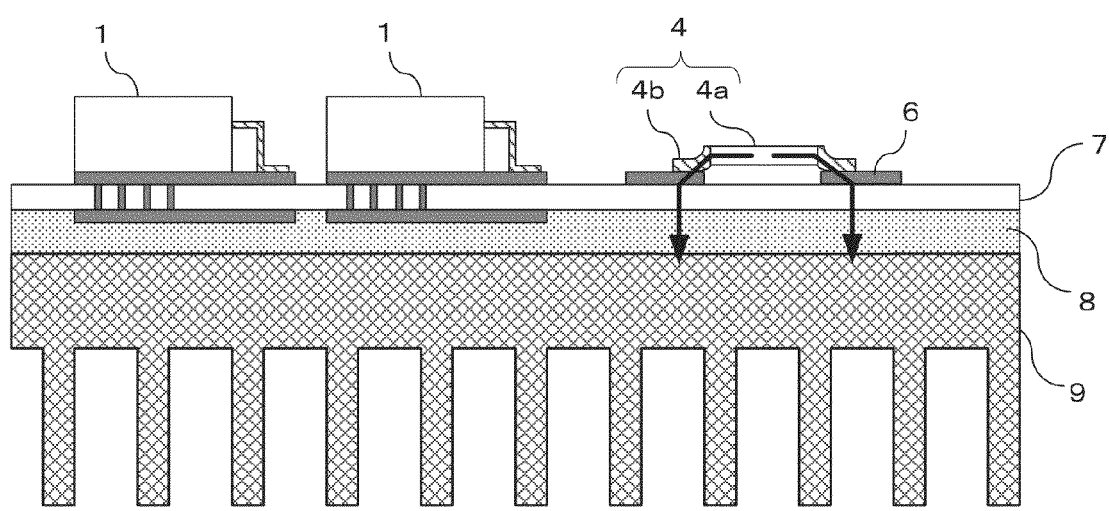
FIG. 7 is a schematic side view showing an inverter apparatus using a related cooling structure for an electronic circuit component.

As will be appreciated from the schematic side view of the inverter apparatus 40 according to the third embodiment shown in FIG. 6, both of the shunt resistors 4 connected in parallel are configured to have a plurality of heat transfer passages to the heat sink 9, as in the first embodiment. Accordingly, the heat quantity (electric power) and the temperature increase of the shunt resistors 4 can be suppressed.

It should be noted that in the third embodiment, the number of the shunt resistors 4 connected in parallel is 2, but the number of the shunt resistors connected in parallel is not limited to the above-described embodiment. Furthermore, the heat sink 9 is used as the radiator, but if the water-cooled type radiator 10 (see FIG. 4) is used as in the second embodiment, further cooling effect for the shunt resistor 4 and the inverter apparatus 40 can be expected.

The first to third embodiments of this invention have been described hereinabove. However, this invention is not limited to the foregoing embodiments, and it is possible that some of the embodiments may be freely combined, modified, or eliminated as appropriate within the scope of the invention. For example, the shunt resistor 4 is not limited to the surface mount-type shunt resistor 4 in which the resistor 4a and the lead terminal 4b are joined to each other, but may be a surface mount-type metal shunt resistor in which the resistor 4a and the lead terminal 4b are made of one metal.

Various modifications and alterations of this invention will be apparent to those skilled in the art without departing from the scope and spirit of this invention, and it should be understood that this invention is not limited to the illustrative embodiments set forth herein.

What is claimed is:

1. A cooling structure for an electronic circuit component, comprising:

a semiconductor switching element mounted on a component side of a circuit board;

a shunt resistor surface-mounted on a solder side opposite to the component side of the circuit board and including a metal lead terminal and a resistor;

a radiator provided on the solder side of the circuit board and configured to release heat generated from the shunt resistor; and an insulating material interposed between the shunt resistor and the radiator and having a high thermal conductivity, wherein the heat generated from the semiconductor switching element is released from the radiator through the insulating material, wherein the heat generated from the shunt resister is released through a heat transfer passage, wherein the heat is transferred from the resistor to the radiator through the heat transfer passage in which the heat from the resistor is directly transferred via the insulating material to the heat sink.

2. The cooling structure for an electronic circuit component according to claim 1, wherein
the lead terminal and the resistor comprise the same metal.

3. The cooling structure for an electronic circuit component according to claim 1, wherein
the insulating material having a high thermal conductivity has a thermal conductivity of 0.1 W/m·K or higher.

4. An inverter apparatus comprising:
the cooling structure for an electronic circuit component according to claim 1.

5. The cooling structure for an electronic circuit component according to claim 1, wherein the heat generated from the shunt resister is further released through another heat transfer passage in which the heat is transferred to the radiator via the lead terminal, a wiring pattern, and the heat insulating material, respectively.

6. The cooling structure for an electronic circuit component according to claim 1, further comprising at least one additional shunt resistor connected in parallel to the shunt resistor, forming a current detecting circuit.

7. The cooling structure for a shunt resistor according to claim 1, wherein the insulating material directly abuts the resistor of the shunt resistor.

8. The cooling structure for a shunt resistor according to claim 1, wherein the radiator cools the semiconductor switching element provided on the component side and the shunt resistor provided on the solder side without any electronic component elements.

* * * * *